United States Patent [19]

Okano

[11] Patent Number: 5,162,893
[45] Date of Patent: Nov. 10, 1992

[54] SEMICONDUCTOR INTEGRATED CIRCUIT DEVICE WITH AN ENLARGED INTERNAL LOGIC CIRCUIT AREA

[75] Inventor: Yoshiaki Okano, Tokyo, Japan

[73] Assignee: Fujitsu Limited, Kawasaki, Japan

[21] Appl. No.: 668,673

[22] Filed: Mar. 7, 1991

Related U.S. Application Data

[63] Continuation of Ser. No. 348,912, May 8, 1989, abandoned.

[30] Foreign Application Priority Data

May 23, 1988 [JP] Japan .................. 63-125454

[51] Int. Cl.⁵ ........................... H01L 23/48
[52] U.S. Cl. .................... 257/203; 257/206; 257/786
[58] Field of Search .............. 357/40, 41, 68, 45, 357/65

[56] References Cited

U.S. PATENT DOCUMENTS

| | | | |
|---|---|---|---|
| 4,591,894 | 5/1986 | Kawakami | 357/41 |
| 4,733,288 | 3/1988 | Sato | 357/40 |
| 4,766,475 | 8/1988 | Kawashima | 357/40 |
| 4,819,047 | 4/1989 | Gilfeather et al. | 357/40 |
| 4,825,107 | 4/1989 | Naganuma et al. | 357/45 |
| 4,893,168 | 1/1990 | Takahashi et al. | 357/42 |
| 4,945,395 | 7/1990 | Suehiro | 357/40 |
| 4,947,233 | 8/1990 | Aso | 357/68 |

FOREIGN PATENT DOCUMENTS

| | | | |
|---|---|---|---|
| 2508255 | 12/1982 | France . | |
| 0012574 | 1/1982 | Japan | 357/40 |
| 0048937 | 3/1983 | Japan | 357/41 |
| 0127347 | 7/1983 | Japan | 357/40 |
| 0012751 | 1/1985 | Japan | 357/40 |
| 0072156 | 4/1987 | Japan | 357/40 |
| 0114258 | 5/1987 | Japan | 357/40 |
| 0239568 | 10/1987 | Japan | 357/40 |
| 62-279656 | 12/1987 | Japan . | |

Primary Examiner—Rolf Hille
Assistant Examiner—Minhloan Tran
Attorney, Agent, or Firm—Armstrong & Kubovcik

[57] ABSTRACT

A semiconductor integrated circuit device includes a semiconductor chip, and bonding pads used for interfacing with an external device. The bonding pads are arranged in an outer portion of a chip peripheral area on the semiconductor chip. A pair of N-channel and P-channel transistor areas is provided for two or more neighboring bonding pads among the bonding pads, and is arranged in the vicinity of the two or more neighboring bonding pads in the chip peripheral area. The pair of N-channel and P-channel transistor areas is used for forming a peripheral circuit used for interfacing with the external device through the related two or more bonding pads. The peripheral circuit related to the two or more neighboring bonding pads is formed by the pair of N-channel and P-channel transistor areas.

23 Claims, 5 Drawing Sheets

FIG. 4B PRIOR ART
FIG. 4A
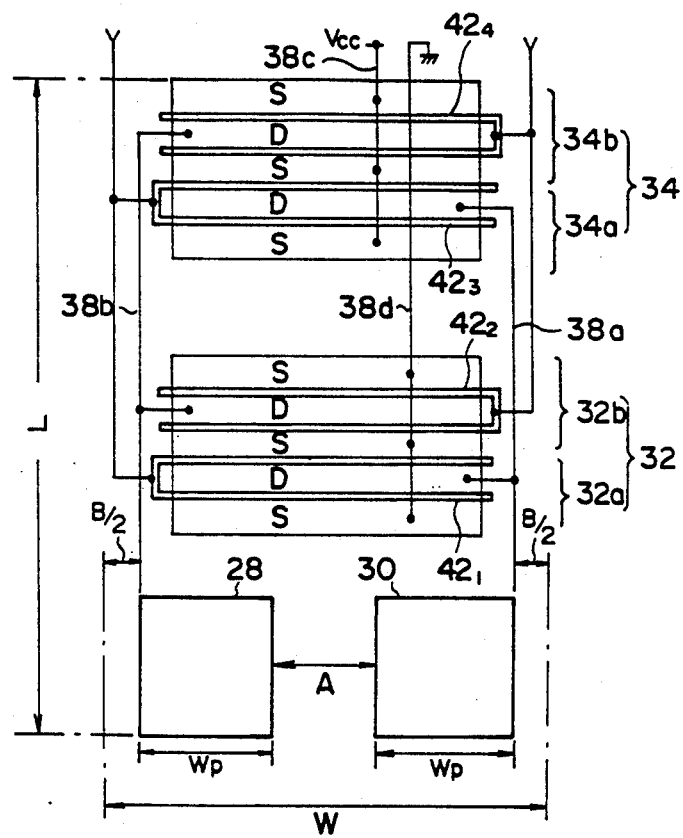
FIG. 4C
FIG. 4D PRIOR ART
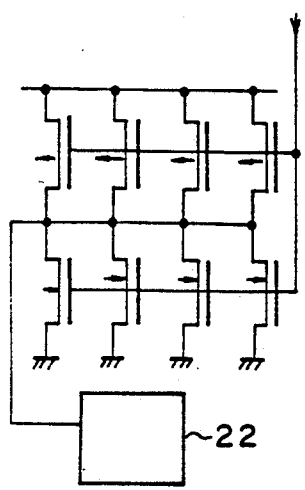

SEMICONDUCTOR INTEGRATED CIRCUIT DEVICE WITH AN ENLARGED INTERNAL LOGIC CIRCUIT AREA

This application is a continuation of application Ser. No. 348,912 filed May 8, 1989, now abandoned.

BACKGROUND OF THE INVENTION

The present invention generally relates to a semiconductor integrated circuit device, and particularly to a semiconductor integrated circuit device having bonding pads arranged in a peripheral portion of a semiconductor chip, and peripheral circuits arranged in the vicinity of bonding pads. More particularly, the present invention relates to an improvement in the arrangement of bonding pads and chip peripheral areas used for forming a peripheral circuit such as an input buffer circuit, an output buffer circuit, or a bi-directional buffer circuit connected to bonding pads.

Conventionally, a plurality of pairs of bonding pads and peripheral circuits are arranged in a peripheral portion of a semiconductor chip. That is, one bonding pad is associated with one peripheral circuit. The above-mentioned arrangement of bonding pads and peripheral circuits creates easy layout design (repetition of one layout pattern) and a large degree of freedom to use bonding pads and related peripheral circuits.

Referring to FIG. 1, there is illustrated a conventional semiconductor integrated circuit device, which includes a semiconductor chip 10, an internal logic circuit area 12, and a chip peripheral area 14. The internal logic circuit area 12 includes a plurality of basic cells arrayed in matrix form, for example. In the chip peripheral area 14 surrounding the internal logic circuit area 12, there are arranged bonding pads 16, and peripheral circuits each having a P-channel transistor area 16a and an N-channel transistor area 16b used for forming a peripheral circuit (or an input/output cell). As is illustrated, one peripheral circuit made up of the transistor areas 16a and 16b is provided for each of the bonding pads 16.

FIG. 2A is an enlarged view of the bonding pad 16 and the P-channel and N-channel transistor areas 16a and 16b illustrated in FIG. 1. The P-channel and N-channel transistor areas 16a and 16b are located on both sides of the bonding pad 16 along an end of the semiconductor chip 10. The P-channel transistor area 16a and N-channel transistor area 16b are connected to the bonding pad 16 by connecting members 20a and 20b, respectively. A power supply line 18 is arranged in the vicinity of the P-channel and N-channel transistor areas 16a and 16b and the bonding pad 16 along the end of the semiconductor chip 10.

Turning now to FIG. 1, there are also a bonding pad 22 and a peripheral circuit area 24. FIG. 2B is an enlarged view of those parts. Referring to FIG. 2B, there are arranged the bonding pad 22, the peripheral circuit area 24 made up of N-channel and P-channel transistor areas 24b and 24a, and the power supply line 18 in this order from the end of the semiconductor chip 10. The P-channel and N-channel transistor areas 24a and 24b and the bonding pads 22 are mutually connected by connecting lines 26, as shown in FIG. 2B. One peripheral circuit is formed by the P-channel and N-channel transistor areas 24a and 24b.

Generally, the size of an output transistor used for forming an output buffer circuit must be large in order to obtain a high driveability for an external load. Even in an input buffer circuit, there is a need for a transistor having a large driveability. For example, a large number of flip-flops is driven by an external clock signal. The above holds true for a bi-directional circuit (an input and output circuit). The larger the size of output transistors, the larger the peripheral circuit area of the semiconductor chip. In the arrangement of FIG. 2A, the number of bonding pads 16 decreases with an increase of each of the P-channel and N-channel transistor areas 16a and 16b. In the arrangement of FIG. 2B, the internal logic circuit area 12 (FIG. 1) reduces with an increase of each of the P-channel and N-channel transistor areas 24a and 24b. This is because the area of each of the P-channel and N-channel transistor areas 24a and 24b must be increased toward the internal logic circuit 12 in order to increase the driveability. It can be seen from the above that there is room for improvement in arrangement of bonding pads and chip peripheral areas.

SUMMARY OF THE INVENTION

It is therefore a general object of the present invention to provide a novel and useful semiconductor integrated circuit device in which the above-mentioned disadvantages are eliminated.

A more specific object of the present invention is to provide a semiconductor integrated circuit device having a reduced chip peripheral area where a peripheral circuit such as an input circuit and an output circuit is effectively formed together with bonding pads.

Another object of the present invention is to provide a semiconductor integrated circuit device having an increased internal logic circuit area to thereby enhance the integration density.

The above objects of the present invention can be achieved by a semiconductor integrated circuit device comprising a semiconductor chip having an internal logic circuit area and a chip peripheral area surrounding the internal logic circuit area, bonding pads used for interfacing with an external device, the bonding pads being arranged in an outer portion of the chip peripheral area, and a pair of N-channel and P-channel transistor areas which is provided for two or more neighboring bonding pads among the bonding pads and is arranged in the vicinity of the two or more neighboring bonding pads in the chip peripheral area. The pair of N-channel and P-channel transistor areas is used for constructing a peripheral circuit used for interfacing with the external device through the two or more neighboring bonding pads. The peripheral circuit related to the two or more neighboring bonding pads is constructed by the pair of N-channel and P-channel transistor areas.

Other objects, features and advantages of the present invention will become apparent from the following detailed description when read in conjunction with the accompanying drawings.

BRIEF DESCRIPTION OF THE DRAWINGS

FIG. 4A is a detailed plan view of the essential part of the first embodiment shown in FIG. 3;

FIG. 4B is a detailed plan view of an essential part of the conventional arrangement;

FIG. 4C is a circuit diagram of the structure of FIG. 4A;

FIG. 4D is a circuit diagram of the structure of FIG. 4B;

DESCRIPTION OF THE PREFERRED EMBODIMENTS

A description is given of a first preferred embodiment of the present invention.

Figure 3:
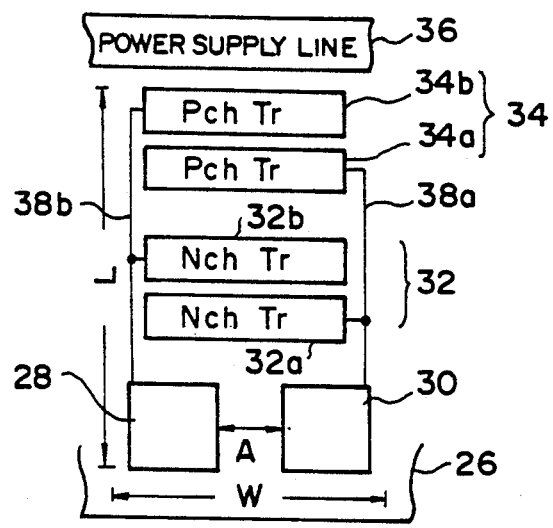
FIG. 3 is a schematic plan view of an essential part of a first embodiment.

Referring to FIG. 3, there is illustrated an essential part of the first embodiment of the present invention. Referring to FIG. 3, a pair of neighboring bonding pads 28 and 30 is arranged in the vicinity of an end of a semiconductor chip 26, or in an outer portion of a chip peripheral area. With respect to the paired bonding pads 28 and 30, there are arranged an N-channel transistor area 32 having two N-channel transistor areas 32a, 32b, and a P-channel transistor area 34 having two P-channel transistor areas 34a and 34b in this order from the bonding pads 28 and 30. The N-channel and P-channel transistor areas 32 and 34 are arranged side by side in the direction perpendicular to the direction of the arrangement of the bonding pads 28 and 30. The N-channel transistor area 32b and the P-channel transistor area 34a are separated from each other by a distance equal to at least the minimum distance required. The transistor areas 32a, 32b, 34a and 34b are used for forming peripheral circuits which are to be connected to the bonding pads 28 and 30. Examples of the peripheral circuits are an input buffer circuit, an output buffer circuit and a bi-directional buffer circuit. In the following description, output buffers are formed by the transistor areas 32a, 32b, 34a and 34b. It is particularly noted that each of the transistor areas 32a, 32b, 34a and 34b is continuously formed along the arrangement of the bonding pads 28 and 30. That is, each of the transistor areas 32a, 32b, 34a and 34b is continuously formed, while the bonding pads 28 and 30 are separated at a distance A, which corresponds to the minimum separation distance determined in view of working requirements for wire bonding (approximately 120 $\mu$m, for example). As a result of the continuous arrangement of each transistor area, a portion of the chip peripheral area corresponding to the distance A is effectively used to form transistors. The transistor areas 32a, 32b, 34a and 34b are mutually connected to form desired peripheral circuits connected to the bonding pads 28 and 30. A power supply line 36 is disposed in the vicinity of the P-channel transistor area 34b.

FIG. 4A is a detailed plan view of the layout of FIG. 3. Referring to FIG. 4A, each of the N-channel transistor areas 32a and 32b can provide four N-channel semiconductor metal oxide (hereinafter simply referred to as MOS) transistors. Similarly, the P-channel transistor areas 34a and 34b can provide four P-channel MOS transistors. L-shaped gate electrodes $42_1$, $42_2$, $42_3$ and $42_4$ related to the transistor areas 32a, 32b, 34a and 34b, respectively, are formed on an insulating layer (not shown) formed on top of the semiconductor chip 26. The drain areas (D) of the N-channel transistor area 32a and the P-channel transistor area 34a are connected to the bonding pad 30 35 through an interconnection line 38a. The drain areas of the N-channel transistor area 32b and the P-channel transistor area 34b are connected to the bonding pad 28 through an interconnection line 38b. Three source areas of the P-channel transistor areas 34a and 34b are supplied with a positive power source voltage Vcc through an interconnection line 38c. Three source areas of the N-channel transistor areas 32a and 32b are connected to ground through an interconnection line 38d. The gate electrodes $42_1$ and $42_3$ are mutually connected through an interconnection line (not shown) and connected to an internal logic circuit area (not shown in FIG. 4A). Similarly, the gate electrodes $42_2$ and $42_4$ are mutually connected through an interconnection line (not shown) and connected to an internal logic circuit formed in the internal logic circuit area. Thereby, two cascaded CMOS inverters are connected to each of the bonding pads 28 and 30.

Figure 1:
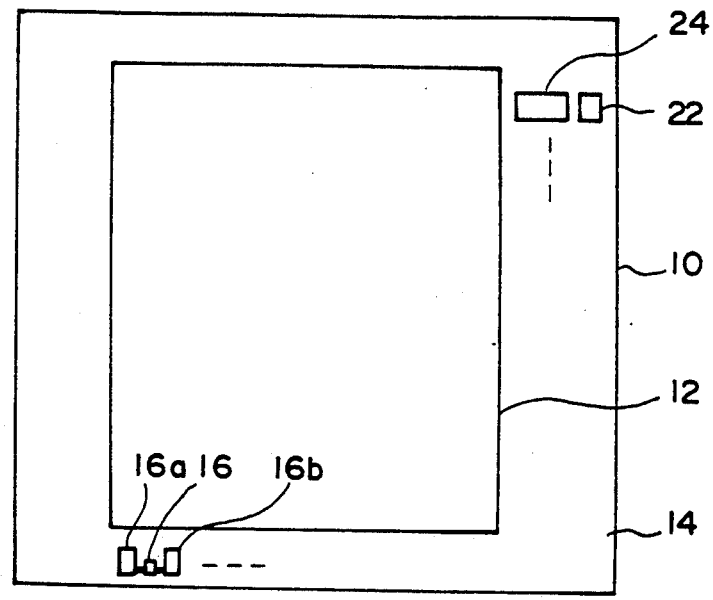
FIG. 1 is a schematic plan view of a semiconductor chip of a conventional semiconductor integrated circuit device.
Figure 2A:
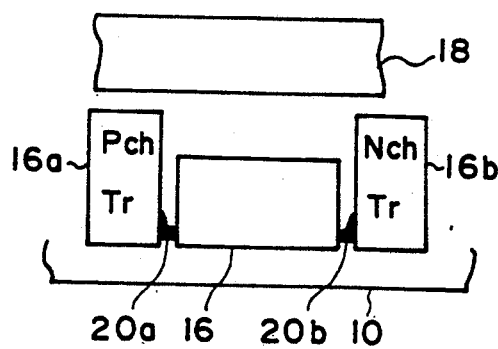
FIG. 2A is a schematic plan view of a conventional arrangement of a bonding pad and transistor areas.
Figure 2B:
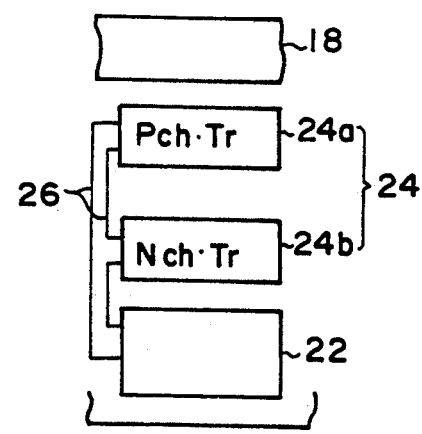
FIG. 2B is a schematic plan view of another conventional arrangement of a bonding pad and transistor areas.

FIG. 4B is a detailed plan view of the conventional arrangement shown in FIG. 2B. FIG. 4B is drawn on a scale identical to that for FIG. 4A. In order to form a circuit equivalent to the circuit of FIG. 4A, two N-channel transistor areas 24b and two P-channel transistor areas 24a must be used. Half of the circuit is illustrated in FIG. 4B for the sake of simplicity. In FIG. 4A, a width W corresponds to a length of an arrangement of the N-channel and P-channel transistor areas 32 and 34 along the end of the semiconductor chip 26. That is, the width W is defined as follows: $W = 2 \times Wp + A + B$, where Wp is the width of each of the bonding pads 28 and 30, B is the separation distance between the adjacent N-channel transistor areas (or P-channel transistor areas), and A is the separation distance between the bonding pads 28 and 30. Similarly, a distance W' is defined for the conventional arrangement of FIG. 4B. The width W' is defined as follows: $W' = 2 \times (Wp + B + C/2)$, where C is twice as long as the distance between an end of the bonding pad 22 and an end of the N-channel transistor area 24b (or the P-channel transistor area 24a). It is also said that the width of each of the pair of the N-channel and P-channel transistor areas 32 and 34 is equal to or smaller than the distance between ends of the two bonding pads 28 and 30 other than opposed ends thereof. In the embodiment of FIG. 4A, the width W is equal to approximately 325 $\mu$m, for example. On the other hand, in the conventional arrangement of FIG. 4B, the width W'/2 is approximately 200 $\mu$m and therefore width W' is approximately 400 $\mu$m. In FIG. 4A, a length L is defined as the length between an end of the bonding pad 28 or 30 close to the end of the semiconductor chip 26 and an end of the P-channel transistor area 34b close to the power supply line 36 (FIG. 3). Similarly, a length L' is defined for the arrangement of FIG. 4B. The length L is approximately identical to the length L', and is approximately 500 $\mu$m, for example.

FIG. 4C is a circuit diagram of the structure illustrated in FIG. 4A, and FIG. 4D is a circuit diagram of the conventional structure shown in FIG. 4B. It is noted that each transistor shown in FIG. 4C has a driveability greater than each transistor shown in FIG. 4D.

Figure 5A:
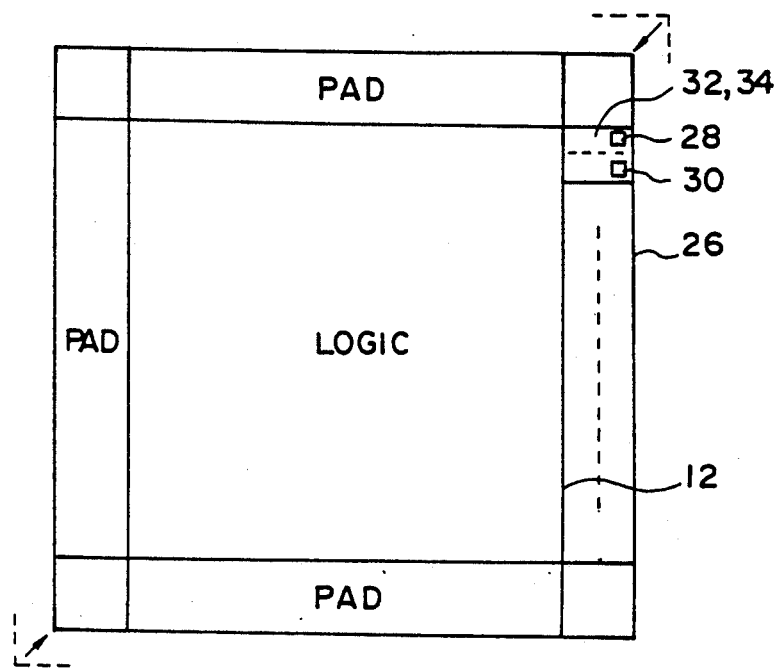
FIG. 5A is a plan view of a semiconductor chip of the present invention.
Figure 5B:
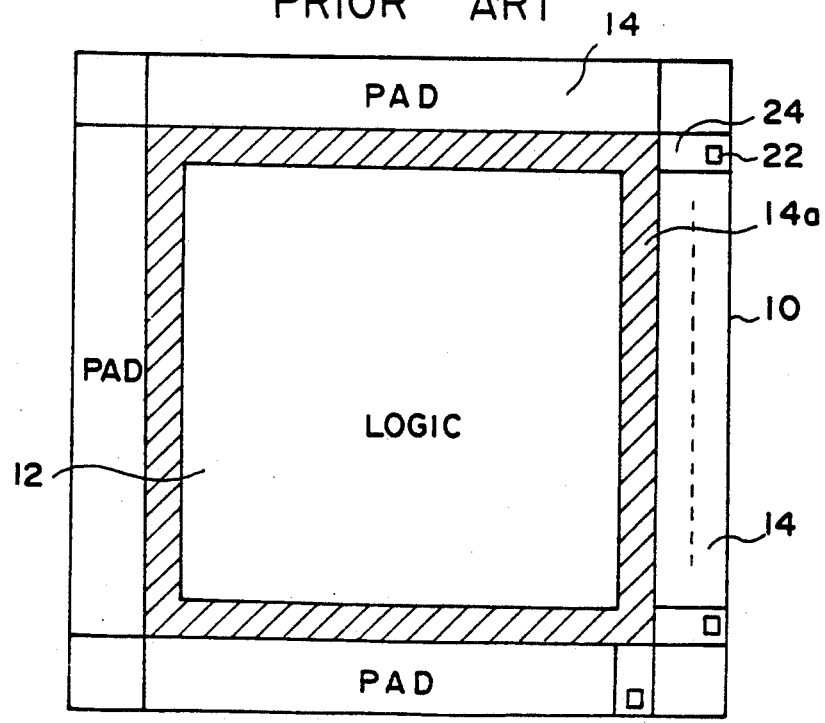
FIG. 5B is a plan view of a conventional semiconductor chip.

FIG. 5A is a plan view of the semiconductor chip 26 of the first embodiment, and FIG. 5B is a plan view of the semiconductor chip 10 having the conventional arrangement shown in FIGS. 2B and 4B. In the case where the same number of bonding pads is arranged along one end of the semiconductor chip, the semiconductor chip 26 is made smaller than the conventional semiconductor chip 10, as indicated by broken lines and related arrows shown in FIG. 5A. In FIG. 5B, there is a possibility that a hatched area 14a interposed in the chip peripheral area 14 and the internal logic circuit area 12 may be left as a wasteful area.

Figure 6:
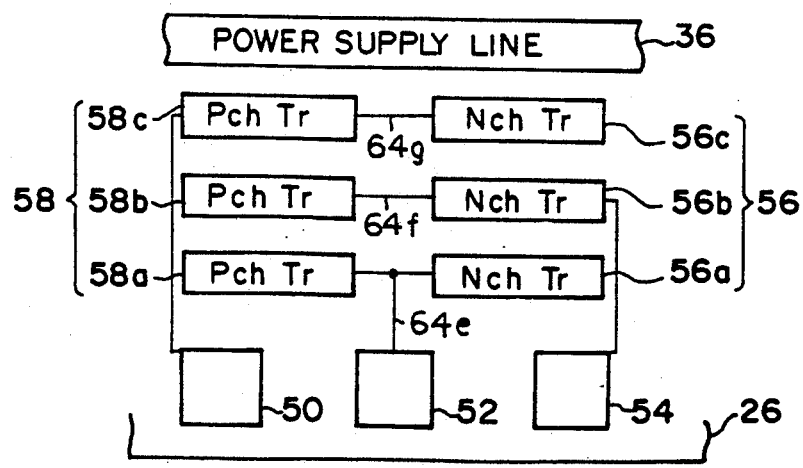
FIG. 6 is a schematic plan view of an essential part of a second embodiment of the present invention.
Figure 7:
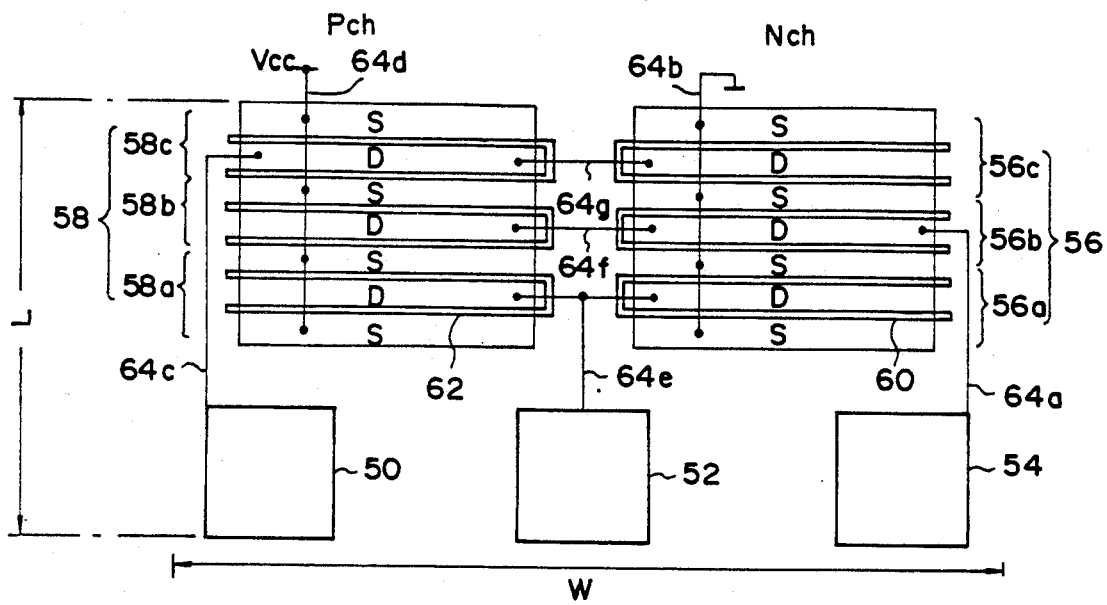
FIG. 7 is a detailed plan view of the essential part of the second embodiment illustrated in FIG. 6.

A description is given of a second preferred embodiment of the present invention with reference to FIGS. 6 and 7. An essential feature of the second embodiment is that a pair of N-channel transistor area 56 and P-channel transistor area 58 arranged along an end of the semiconductor chip 26 is provided for three neighboring bonding pads 50, 52 and 54. Particularly, the second embodiment is intended to reduce the length L of a chip peripheral circuit area. The distance between the neighboring bonding pads such as bonding pads 50 and 52 is set equal to a distance which is larger than the minimum separation distance and is approximately identical to that for the conventional arrangement of FIG. 4B, for example. The N-channel and P-channel transistor areas 56 and 58 are arranged side by side in the direction corresponding to the arrangement of the 15 bonding pads 50, 52 and 54. The N-channel transistor area 56 has three N-channel transistor areas 56a, 56b and 56c, each of which presents two N-channel MOS transistors. Similarly, the P-channel transistor area 58 has three P-channel MOS transistor areas 58a, 58b and 58c, each of which presents two P-channel MOS transistors. Three gate electrodes 60 are provided for the N-channel transistor area 56, and three gate electrodes 62 are provided for the P-channel transistor area 58. The drain area of the N-channel transistor area 56b is connected to the related bonding pad 54 through an interconnection line 64a. The source areas of the N-channel transistor areas 56a, 56b and 56c are connected to ground through an interconnection line 64b. The drain areas of the N-channel transistor areas 56a, 56b and 56c are connected to those of the P-channel transistor areas 58a, 58b and 58c, through interconnection lines 64e, 64f and 64g, respectively. The source areas of the P-channel transistor areas 58a, 58b and 58c are supplied with the positive power source voltage Vcc. The drain area of the P-channel transistor area 58c is connected to the bonding pad 50 through an interconnection line 64c. The drain areas of the N-channel transistor area 56a and P-channel transistor area 58a are connected to the bonding pad 52 through the interconnection line 64e. In this manner, three output buffer circuits each including two cascaded CMOS inverters are formed and connected to each of the bonding pads 50, 52 and 54. The width W of the arrangement of FIG. 6 is approximately 625 μm, for example, and the length L is approximately 350 μm. On the other hand, in the case where the same output buffer circuits are constructed by the conventional arrangement shown in FIG. 4A, the width W' is approximately 600 μm (=3×200), and the length L' is approximately 500 μm. It can be seen that according to the second embodiment, it becomes possible to extremely reduce the length of a chip peripheral circuit, although the width W thereof is approximately equal to or slightly exceeds the width W' for the conventional arrangement.

Figure 8:
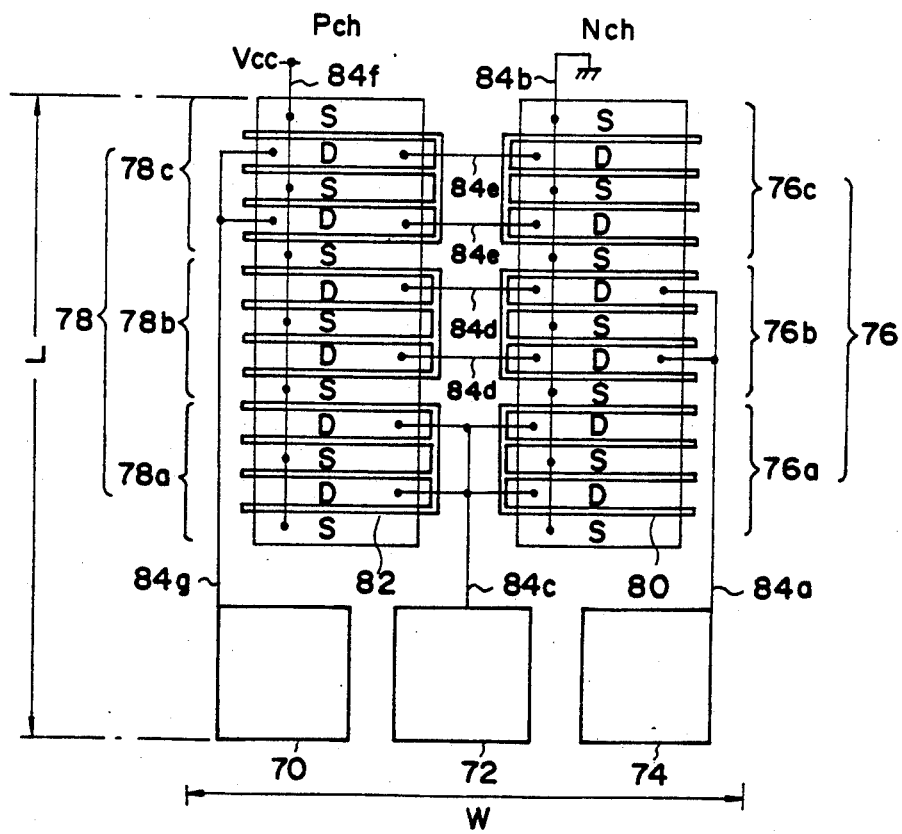
FIG. 8 is a detailed plan view of an essential part of a third embodiment of the present invention.

A description is given of a third preferred embodiment of the present invention with reference to FIG. 8. The third embodiment corresponds to a variation of the second embodiment shown in FIGS. 6 and 7. A pattern of a peripheral circuit is elongated in the length direction. In other words, the separation distance between the neighboring bonding pads in the third embodiment is reduced, as compared with the second embodiment. Referring to FIG. 8, a pair of N-channel transistor area 76 and P-channel transistor area 78 is provided for three neighboring bonding pads 70, 72 and 74. The separation distance between the neighboring bonding pads such as the bonding pads 70 and 72 is set equal to the minimum separation distance, for example.

Each of the N-channel and P-channel transistor areas 76 and 78 is smaller in width than each of N-channel and P-channel transistor areas 56 and 58 shown in FIG. 7. Therefore, in order to obtain almost the same driveability, it is required to use an increased number of transistors. The N-channel transistor area 76 has three N-channel transistor areas 76a, 76b and 76c, each provided with one gate electrode 80 having four extensions. Each of the three N-channel transistor areas 76a, 76b and 76c presents four N-channel MOS transistors. Similarly, the P-channel transistor area 78 has three P-channel transistor areas 78a, 78b and 78c, each provided with one gate electrode 82 having four extensions. Each of the three P-channel transistor areas 78a, 78b and 78c presents four P-channel MOS transistors.

The drain areas of the N-channel transistor area 76b is connected to the bonding pad 74 through an interconnection line 84a. The drain areas of the N-channel transistor area 76a are connected to the drain areas of the P-channel transistor area 78a through interconnection lines 84c, and to the bonding pad 72 therethrough. The drain areas of the N-channel transistor area 76c are connected to the drain areas of the P-channel transistor area 78c through interconnection lines 84e. The drain areas of the P-channel transistor area 78c are connected to the bonding pad 70 through an interconnection line 84g. The source areas of the N-channel transistor area 76 are connected to ground through an interconnection line 84b. The source areas of the P-channel transistor area 78 are supplied with the positive power source voltage Vcc through an interconnection line 84f. With the above-mentioned structure and interconnection lines, output buffer circuits each made up of four CMOS inverters are formed for the bonding pads 70, 72 and 74.

The width W of the arrangement of FIG. 8 is set equal to approximately 425 μm, for example, and the length L thereof is set equal to approximately 500 μm. On the other hand, the equivalent output buffer circuit may be constructed by using the conventional arrangement of FIG. 4B, where the width W, is approximately 600 μm and the length L' is almost identical to the length L.

The interconnection lines used in the aforementioned embodiments are provided so as to form output buffer circuits. It is easy to construct input buffer circuits or bi-directional input circuits simply by changing the pattern of the interconnection lines. That is, it is preferable to form the present invention as a master slice type semiconductor integrated circuit. Further, the aforementioned interconnection lines may be constructed by a single layer structure or a multilayer structure. It is possible to arrange different types of the aforementioned embodiments in a single semiconductor chip. It is possible to interchange the N-channel transistor areas and P-channel transistor areas used in the aforementioned embodiments. For example, it is possible to interchange the N-channel and P-channel transistor areas 32 and 34.

The present invention is particularly advantageous to a multi-bit semiconductor integrated circuit device such as a 16-bit or 32-bit device. For example, it becomes possible to efficiently arrange bonding pads and related peripheral circuits relating to signals of the same type consisting of a number of bits, such as an address signal and a data signal. Further, one peripheral circuit pattern is provided for a plurality of bits, or in other words, peripheral circuit patterns are integrally formed. Thus, it becomes possible to enhance resistance to an electrostatic voltage and latch-up. It is also possible to form a protection circuit together with an output buffer circuit by using P-channel and N-channel transistor areas.

The present invention is not limited to the aforementioned embodiments, and variations and modifications may be made without departing from the scope of the present invention.

What is claimed is:

1. A semiconductor integrated circuit device, comprising:
a semiconductor chip having a central logic circuit area, a peripheral circuit area surrounding said logic circuit area, and bonding pads for interfacing with an external device positioned along edges of said chip in an outer portion of said peripheral circuit area; and
a plurality of peripheral circuits formed in said peripheral circuit area inwardly of said bonding pads toward said logic circuit area, said plurality of peripheral circuits having a plurality of N-channel and a plurality of P-channel transistors formed in parallel rows and connected in pairs, each pair including an N-channel and a P-channel transistors each transistor having a largest side portion extending parallel to said chip edge such that each said pair of transistors extends a distance along a periphery of said chip substantially equal to a distance occupied by a plurality of adjacent bonding pads and a distance defined between said adjacent bonding pads formed along said chip edge,
wherein a pair of said transistors is connected to form one of a plurality of peripheral circuits, said plurality of peripheral circuits being equal in number to said plurality of adjacent bonding pads, one of said plurality of peripheral circuits being respectively connected to one of said plurality of adjacent bonding pads arranged along said chip edge, wherein a source/drain region of each of said P-channel transistors and N-channel transistors is disposed so that imaginary lines extending from opposite edges of said adjacent bonding pads toward said central logic area cross another imaginary line extending from said source/drain region along the length of each of said P-channel transistors and said N-channel transistors.

2. A semiconductor integrated circuit device as claimed in claim 1, wherein each said transistor has a largest side portion substantially equal to a peripheral distance of two adjacent bonding pads and a distance defined between said bonding pads, and said transistors are formed as a first group of N-channel transistors and a second group of P-channel transistors, one group being positioned inwardly of the other on said chip, wherein said plurality of peripheral circuits comprises two circuits each composed of at least one pair of transistors.

3. A semiconductor integrated circuit device as claimed in claim 2, wherein said pair of N-channel and P-channel are arranged side by side in a direction perpendicular to a direction of arrangement of said two adjacent bonding pads.

4. A semiconductor integrated circuit device as claimed in claim 2, wherein each paired N-channel and P-channel transistor for said two adjacent bonding pads is continuously formed.

5. A semiconductor integrated circuit device as claimed in claim 2, wherein a width of each said paired N-channel and P-channel transistor is equal to or smaller than a distance between opposite ends of said two bonding pads.

6. A semiconductor integrated circuit device as claimed in claim 2, wherein said two adjacent bonding pads are separated from each other at a minimum separation distance determined in view of working requirements of wire bonding.

7. A semiconductor integrated circuit device as claimed in claim 2, wherein each of said peripheral circuits comprises a plurality of pairs of transistors.

8. A semiconductor integrated circuit device as claimed in claim 1, wherein each pair of transistors is formed in end-to-end relationship parallel to said chip edge, and the combined major dimensions of each pair of transistors is substantially equal to the peripheral distance of three adjacent bonding pads, and wherein said plurality of peripheral circuit comprises three circuits each composed of at least one pair of transistors.

9. A semiconductor integrated circuit device as claimed in claim 8, wherein said pair of N-channel and P-channel transistors is arranged side by side along the adjacent bonding pads.

10. A semiconductor integrated circuit device as claimed in claim 8, wherein each of said paired N-channel and P-channel transistors is considerably wider than each of the adjacent bonding pads.

11. A semiconductor integrated circuit device as claimed in claim 8, wherein a distance between the adjacent bonding pads is larger than a minimum separation distance determined in view of working requirement for wire bonding.

12. A semiconductor integrated circuit device as claimed in claim 8, wherein the distance between adjacent bonding pads is almost identical to a minimum separation distance determined in view of working requirements for wire bonding.

13. A semiconductor integrated circuit device as claimed in claim 8, wherein each of said peripheral circuits is composed of a plurality of pairs of transistors.

14. A semiconductor integrated circuit device as claimed in claim 1, wherein said paired N-channel and P--channel transistors comprise a plurality of source and drain areas alternately arranged in a direction perpendicular to a direction of the arrangement of said bonding pads.

15. A semiconductor integrated circuit device as claimed in claim 1, wherein said semiconductor integrated circuit device is a master slice type semiconductor integrated circuit device.

16. A semiconductor integrated circuit device as claimed in claim 15, further comprising a gate electrode provided for each of said N-channel and P-channel transistors, and interconnection lines used for coupling said bonding pads, said P-channel and N-channel transistors, said gate electrodes and said internal logic circuit area.

17. A semiconductor integrated circuit device as claimed in claim 1, wherein said peripheral circuits comprise an input buffer circuit for buffering a signal supplied from said external device through one of said bonding pads.

18. A semiconductor integrated circuit device as claimed in claim 1, wherein said peripheral circuits comprise an output buffer circuit for buffering a signal to be outputted to said external device through one of said bonding pads.

19. A semiconductor integrated circuit device as claimed in claim 1, wherein said peripheral circuits comprise a bi-directional buffer circuit having the function of outputting and inputting a signal to and from said external device.

20. A semiconductor integrated circuit device as claimed in claim 1, wherein said peripheral circuits comprise a buffer circuit which is provided for each of said plurality of bonding pads and is formed by said pair of N-channel and P-channel transistors.

21. A semiconductor integrated circuit device, comprising:
a semiconductor chip having an internal logic circuit area having internal logic circuits, and a chip peripheral area surrounding said internal logic circuit;
a plurality of output electrodes positioned along edges of said semiconductor chip in an outer portion of said chip peripheral area; and
a plurality of output circuits for outputting signals supplied from said internal logic circuits to said output electrodes, each of said output circuits including a pair of P-channel transistor and N-channel transistor, one pair of P-channel transistor and N-channel transistor being respectively connected to one of said plurality of output electrodes;
wherein each of said output circuits extends a distance along a chip edge of said semiconductor chip substantially equal to a distance occupied by at least two adjacent ones of said output electrodes and a distance defined between said at least two output electrodes arranged along one of said semiconductor chip edges,
wherein at least two of said output circuits are arranged between said internal logic circuit area and said at least two adjacent ones of said output electrodes, and wherein a source/drain region of each of said P-channel transistors and N-channel transistors is disposed so that imaginary lines extending from the opposite edges of said adjacent bonding pads toward said central logic area cross another imaginary line extending from said source/drain region along the length of each of said Pl-channel transistors and said N-channel transistors.

22. A semiconductor integrated circuit device, comprising:
a semiconductor chip having a central logic circuit area, a peripheral circuit area surrounding said logic circuit area, and bonding pads for interfacing with an external device positioned along edges of said chip in an outer portion of said peripheral circuit area; and
a plurality of peripheral circuits formed in said peripheral circuit area inwardly of said bonding pads toward said logic circuit area, said plurality of peripheral circuits having a plurality of N-channel and a plurality of P-channel transistors formed in parallel rows and connected in pairs, each pair including an N-channel and a P-channel transistors a distance being defined between said adjacent bonding pads formed along said chip edge,
wherein said plurality of bonding pads are aligned substantially parallel to said chip edge,
wherein each of said plurality of N-channel transistors and said plurality of P-channel transistors has a length greater than a distance between opposite edges of said adjacent bonding pads and has a channel width smaller than a distance between other edges of said adjacent bonding pads other than said opposite edges of said adjacent bonding pads,
wherein a pair of said transistors is connected to form one of a plurality of peripheral circuits, said plurality of peripheral circuits being equal in number to said plurality of adjacent bonding pads, one of said plurality of peripheral circuits being respectively connected to one of said plurality of adjacent bonding pads arranged along said chip edge, and
wherein a source/drain region of each of said P-channel transistors and N-channel transistors is disposed so that imaginary lines extending from said opposite edges of said adjacent bonding pads toward said central logic area cross another imaginary line extending from said source/drain region along the length of each of said P-channel transistors and said N-channel transistors.

23. A semiconductor integrated circuit device as claimed in claim 22 wherein said P-channel transistors and N-channel transistors form at least one of input and output circuits related to said respective adjacent pads.

* * * * *